United States Patent
Nukiyama et al.

[11] Patent Number: 5,321,364
[45] Date of Patent: Jun. 14, 1994

[54] NETWORK ANALYZER

[75] Inventors: Akira Nukiyama; Hideki Yamashita, both of Tokyo, Japan

[73] Assignee: Hewlett Packard Company, Palo Alto, Calif.

[21] Appl. No.: 972,886

[22] Filed: Nov. 6, 1992

Related U.S. Application Data

[63] Continuation of Ser. No. 736,025, Jul. 25, 1991, abandoned.

[30] Foreign Application Priority Data

Jul. 26, 1990 [JP] Japan ................. 2-198707

[51] Int. Cl.⁵ .................................. G01R 27/28
[52] U.S. Cl. ........................... 324/601; 324/615; 364/578; 364/482
[58] Field of Search ............ 364/488, 489, 578; 333/17.3, 860, 861; 455/121, 123, 124, 125; 324/601, 615

[56] References Cited

U.S. PATENT DOCUMENTS

| | | | |
|---|---|---|---|
| 3,796,950 | 3/1974 | Kuecken | 324/642 |
| 3,969,666 | 7/1976 | Simon | 324/650 |
| 4,283,794 | 8/1981 | Underhill | 455/226 |
| 4,463,308 | 7/1984 | Underhill | 324/638 |
| 5,047,971 | 9/1991 | Horwitz | 364/488 |
| 5,079,507 | 1/1992 | Ishida | 324/645 |
| 5,121,063 | 6/1992 | Kerkow | 324/601 |

OTHER PUBLICATIONS

Rytting, Douglas K., "An Analysis of Vector Measurement Accuracy Enhancement Techniques (& Appendix Thereto)," Hewlett-Packard Company RF & Microwave Measurement Symposium and Exhibition, Printed Mar. 1982.

Rytting, Douglas K., "Advances in Microwave Error Correction Techniques," Hewlett-Packard Company RF & Microwave Measurement Symposium and Exhibition, Printed Jun. 1987.

Rytting, Douglas K., "Let Time Domain Response Provide Additional Insight Into Network Behavior," Hewlett-Packard Company RF & Microwave Measurement Symposium and Exhibition, Printed Sep. 1988.

Rytting, Douglas K., "Improved RF Hardware and Calibration Methods for Network Analyzers," Hewlett-Packard Company RF & Microwave Measurement Symposium and Exhibition, ©1991 (no month).

Robert L. Thomas, Artech House Inc (1976), "A Practical Introduction to Impedance Matching", (no month).

*Primary Examiner*—Kenneth A. Wieder
*Assistant Examiner*—Jose M. Solis
*Attorney, Agent, or Firm*—Woodcock Washburn Kurtz Mackiewicz & Norris

[57] ABSTRACT

A network analyzer having means for determining the type and element values of a hypothetical lossless matching circuit for a device under test (DUT) and for computing and displaying S parameters of the DUT in combination with the matching circuit.

4 Claims, 4 Drawing Sheets

X = REACTANCE
Y = SUSCEPTANCE

X = REACTANCE
Y = SUSCEPTANCE

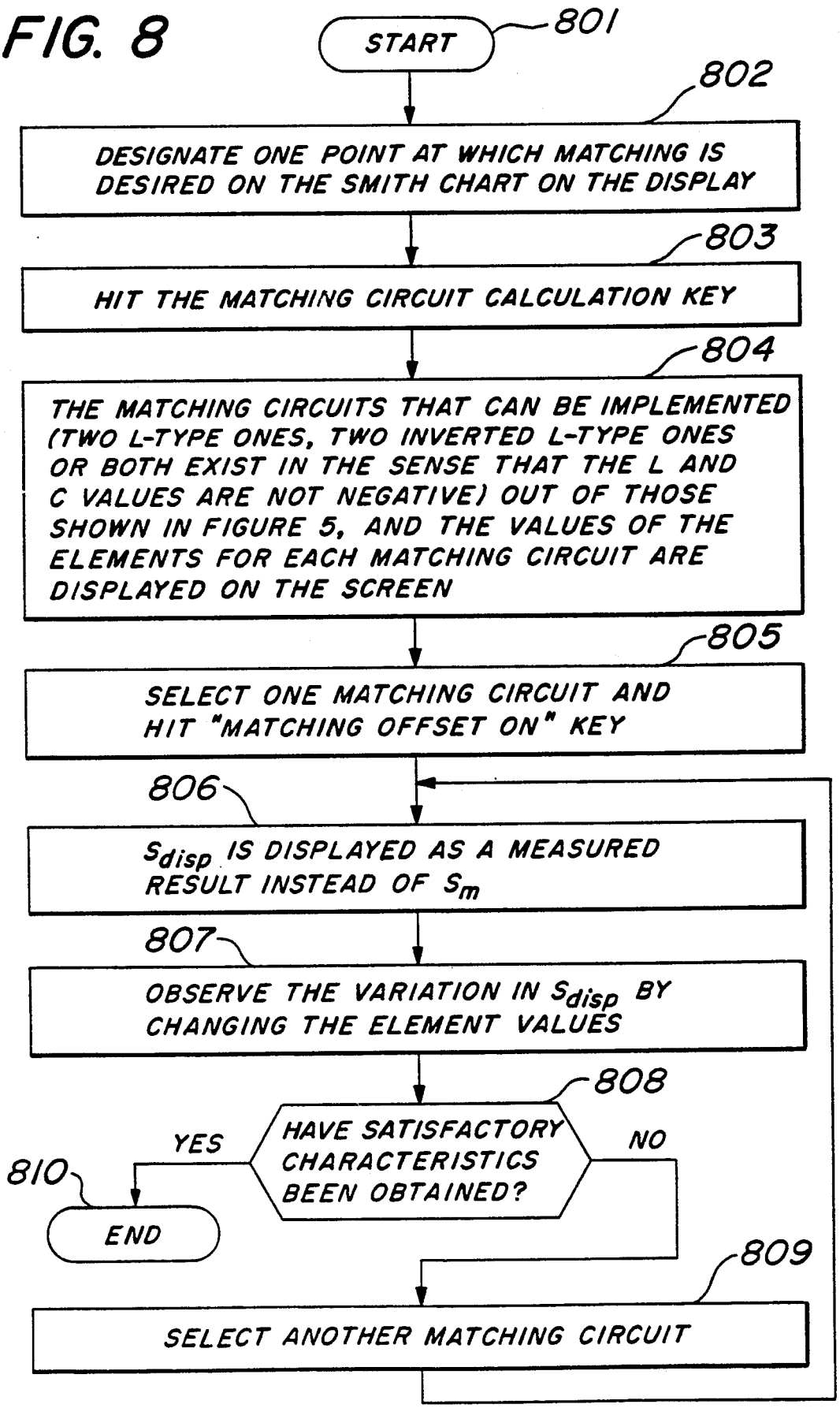

NETWORK ANALYZER

This is a continuation of application Ser. No. 736,025, filed Jul. 25, 1991, now abandoned.

FIELD OF THE INVENTION

The present invention generally relates to network analyzers and more particularly relates to network analyzers capable of supporting the efficient design of a matching circuit.

BACKGROUND OF THE INVENTION

A conventional network analyzer displays the scattering parameters, or S parameters, $S_{11}$ and/or $S_{22}$ of a device under test (DUT) on a Smith chart. (S parameters are reflection and transmission coefficients and are familiar to RF and microwave designers. S parameters are directly related to impedances and reflection coefficients.) The user then determines the necessary characteristics of a matching circuit by reading the information displayed on the Smith chart. The matching circuit's purpose is to improve the reflection coefficient of the DUT, i.e., to match the impedance of the DUT to the characteristic impedance of its intended environment. The user graphically designs the matching circuit by plotting the DUT's S parameters on a Smith chart and determining the complex impedance and/or admittance values necessary to transform the S parameters to a prescribed point or set of points on the chart. However, it is often very difficult to accurately read data from the Smith chart.

Alternatively, one could have a computer such as an EWS (engineering workstation) acquire the measurement data and calculate the desired matching circuit data with CAE (computer aided engineering) software. This method, however, requires software for controlling a measuring instrument (e.g., a network analyzer) and for data transmission in addition to the computer and CAE software, rendering the system unnecessarily large and expensive.

Moreover, the method of programming an EWS or the like to acquire the measurement data from a network analyzer and carry out the necessary calculations is not suitable for performing real-time evaluations that follow changes in the environment (e.g., changes in temperature) of the DUT.

Furthermore, in many cases the calculated values of the parameters of the matching circuit do not coincide with those of realizable circuit elements (such as inductances and capacitances). Accordingly, it may be necessary to evaluate the characteristics of the DUT with an actual matching circuit attached.

In addition, if the user has only a network analyzer, he or she must actually make a trial matching circuit and measure its characteristics.

SUMMARY OF THE INVENTION

An important object of the present invention is to overcome the above-described drawbacks of the prior art and, in particular, to provide a means for efficiently developing matching circuits. A further object of the present invention is to enable a user to determine the type of matching circuit and its circuit parameters on a network analyzer and to perform real-time simulations.

The present invention encompasses apparatus comprising measuring means for measuring, and providing a signal indicative of, a first parameter of a device under test (DUT), matching means for determining, on the basis of the first parameter, a second parameter for matching the DUT to a prescribed condition, and means for calculating, on the basis of the first and second parameters, a third parameter that represents an approximation of a result to be measured if the DUT were combined with a matching circuit.

One embodiment of the present invention further comprises means for selectively modifying the second parameter.

In a second embodiment of the present invention the measuring means comprises means for measuring an S parameter of the DUT.

In another embodiment the matching means comprises means for determining a parameter of a matching circuit for matching the DUT to a prescribed impedance value.

A preferred embodiment of a network analyzer embodying the present invention includes means for calculating the type and the circuit parameters of a matching circuit based on measured S parameters of the DUT. That network analyzer calculates and displays the result that would be obtained if the DUT were measured with the matching circuit connected.

The present invention also encompasses methods for characterizing a DUT that comprise the steps of measuring a first parameter of the DUT, determining, on the basis of the first parameter, a second parameter for matching the DUT to a prescribed condition, and calculating, on the basis of the first and second parameters, a third parameter that represents an approximation of a result to be measured if the DUT were combined with a matching circuit designed to provide the second parameter.

Other features of the present invention are described below in connection with the detailed description of a preferred embodiment.

BRIEF DESCRIPTION OF THE DRAWINGS

FIG. 8 is a flow diagram of the procedure for designing matching circuits in accordance with the present invention.

DETAILED DESCRIPTION OF A PREFERRED EMBODIMENT

Figure 1:
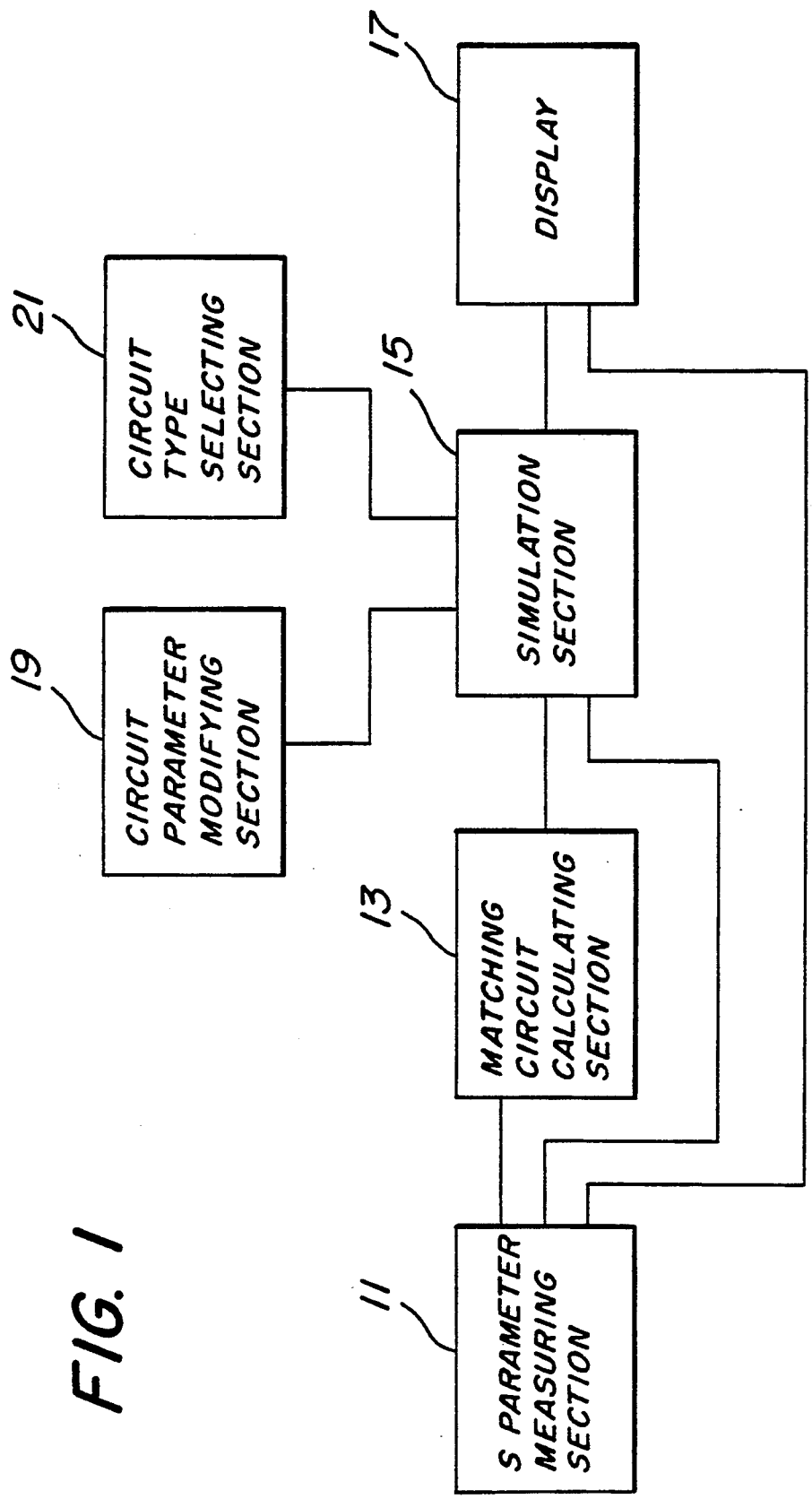
FIG. 1 is a diagram illustrating an embodiment of the present invention.

FIG. 1 shows a schematic block diagram of a network analyzer in accordance with the present invention. In FIG. 1, when using the network analyzer as an ordinary one, measurement results from the S parameter measuring section 11 are directly displayed on a display 17. The calculation of a matching circuit and simulation thereof in accordance with the present invention may be carried out as follows:

First, by using the value the user has designated with a marker from the measurement results of a DUT from the S parameter measuring section 11 and displayed on the display 17, a matching circuit calculating section 13 calculates circuit parameters for matching the DUT with a characteristic impedance e.g., (50Ω), and the result is stored in a buffer in a simulation section 15.

The expected S parameter to be obtained when the matching circuit thus calculated is connected to the DUT is then calculated and the result of the simulation is displayed on the display 17. What the user designates with the marker is one point on a locus showing the variation of the S parameter as the frequency changes; that is, the user designates the S parameter at a particular frequency.

Accordingly, the display of the output of the simulation section 15 provides the variation in the S parameter to be observed over a certain frequency range in case the matching circuit which gives an exact matching at a particular frequency is connected. That is, a frequency-induced variation of the offset from the matched state is provided.

In addition, in the event the values of the circuit parameters obtained by the matching circuit calculation section 13 should be impossible to obtain, or that the degree of matching with errors in the circuit elements should be evaluated, etc., a circuit parameter modifying section 19 is provided for modifying/setting values of circuit parameters through a keyboard or the like.

There exist a plurality of types of matching circuits capable of providing correct matching with respect to given S parameters, even if the matching circuit is to be configured with two LC components. A circuit type selecting section 21 selects the type of matching circuit. When the calculation of the circuit parameters for a matching circuit is instructed, the circuit type selecting section 21 presents to the user possible matching circuit types and the circuit parameters for each of these types. The user may select one among them to have the simulation section 15 simulate the result to be obtained when the selected matching circuit is used (or when the circuit parameters of the selected matching circuit are modified). If the result of this simulation is not satisfactory, the user can return to the stage of the selection of a type of matching circuit (by, for instance using a soft key).

There will be explained below the method for calculating the matching circuit, and the method executed in the simulation section 15 for performing the calculation for the matching circuit simulation in the event the matching circuit is added to the DUT. First, the method for calculating a matching circuit will be explained.

Figure 2:
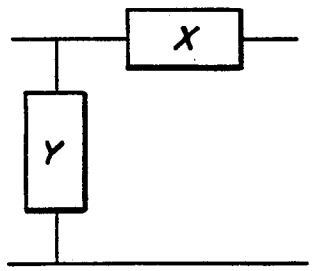
FIG. 2 is a diagram illustrating a lossless L-type matching circuit.
Figure 3:
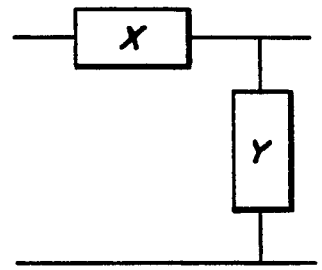
FIG. 3 is a diagram illustrating a lossless inverted L-type matching circuit.

With regard to the matching circuit to be obtained, we will here focus on the lossless L-type (FIG. 2) and inverted L-type (FIG. 3). As long as the DUT does not have negative resistance, an arbitrary point on the Smith chart can always be moved to a matching point $(Z_0+j0)$ along a circle of constant-R (or a circle of constant-G) and the circle of $G=1/Z_0$ (the circle of $R=Z_0$). In other words, with an appropriate one of the types mentioned above, matching will always be obtained at any one arbitrary frequency.

Figure 5:
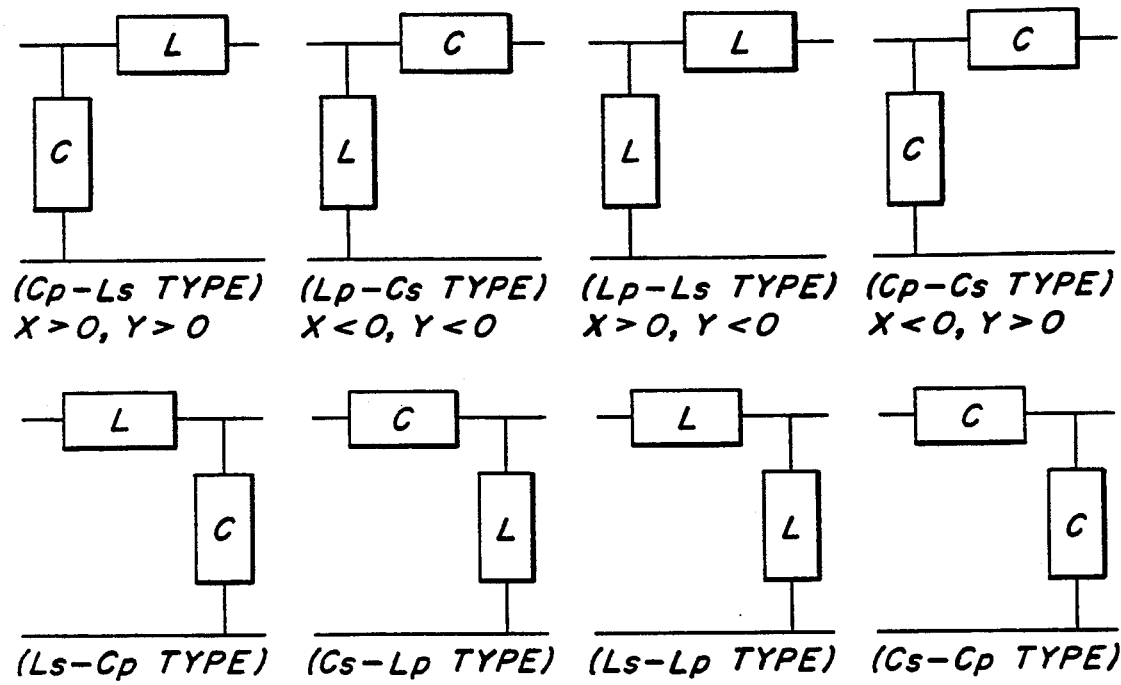
FIG. 5 is a diagram illustrating the forms of the embodiments of the matching circuits shown in FIGS. 2 and 3.

Thus, firstly, the measured value ($S_{11}$ or $S_{22}$) at a point designated on a Smith chart with a marker is converted to impedance ($Z_m$), and then the four-terminal matrix is obtained which converts the impedance $Z_m$ to the characteristic impedance $Z_0$. The reactance X and the susceptance y of the L-type and inverted L-type matching circuits (FIGS. 2 and 3) are obtained based on this four-terminal matrix. The type (L or C) of the circuit element of the matching circuits (FIGS. 2 and 3) are obtained based on this four-terminal matrix. As shown in FIG. 5, the type (L or C) of the circuit element of the matching circuit and its value can be identified based on the signs of the reactance X and the susceptance Y.

Figure 4:
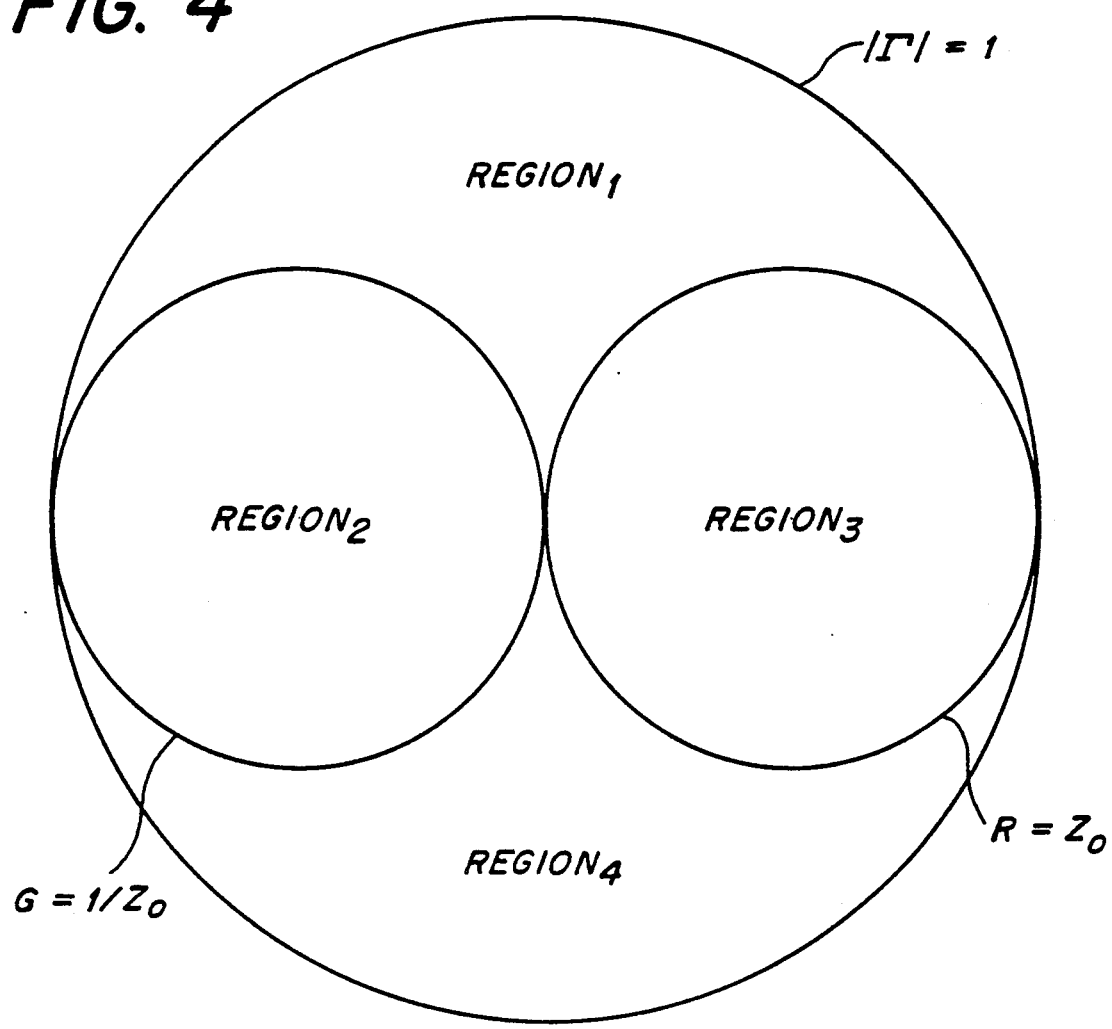
FIG. 4 is a diagram illustrating regions on the Smith chart which determine the type of the matching circuit that can be realized when the matching circuits shown in FIGS. 2 and 3 are used.

Table 1 shows the type of matching circuit shown in FIG. 5 that can be implemented for each region (and each boundary of the regions) to which the reflection coefficient belongs on the Smith chart as shown in FIG. 4.

TABLE 1

| Region | Type of matching Circuit that can be implemented | |
|---|---|---|
| Region 1 | Cp - Cs | Lp - Cs |
|  | Ls - Cp | Cs - Cp |
| Region 2 | Cp - Ls | Lp - Cs |
| Region 3 | Ls - Cp | Cs - Lp |
| Region 4 | Cp - Ls | Lp - Ls |
|  | Ls - Lp | Cs - Lp |
| Boundary 1-2 | Cp - Ls | Lp - Cs |
|  | Ls - Cp |  |
| Boundary 1-3 | Cs - Cp | Ls - Cp |
|  | Cp - Cs |  |
| Boundary 2-4 | Cp - Ls | Lp - Ls |
|  | Ls - Lp |  |
| Boundary 3-4 | Cp - Ls | Cs - Lp |
|  | Ls - Cp |  |

Means are provided for preventing the presentation of a matching circuit that cannot be implemented with passive circuit elements to the user. This arrangement further improves the efficiency of designing matching circuits.

Figure 6:
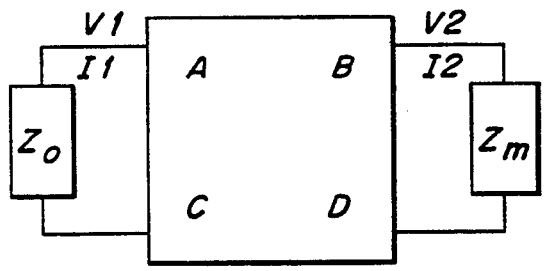
FIG. 6 is a diagram illustrating electrical connections between a matching circuit as a four-terminal electrical network and a DUT.

A specific algorithm for the computation will be explained with reference to FIG. 6.

The symbols used are defined as follows:

DUT reflection coefficient (measurement value): $S_m$ ($S_{11}$ or $S_{22}$)

Characteristic impedance: $Z_0$ (50Ω/75Ω)

Here, the DUT input impedance $Z_m$ can be represented as follows:

$$Z_m = a + jb$$
$$= Z_0 * (1 + S_m)/(1 - S_m).$$

It is assumed that a voltage $V_1$ and a current $I_1$ on the input side of the matching circuit can be represented in terms of the voltage $V_2$ and the current $I_2$ on the output side as follows:

$$V_1 = A*V_2 + B*I_2.$$

Hence, because the following relationship holds:

$$V_1/I_1 = Z_0$$

$$V_2/I_2 = Z_m = a + jb,$$

we obtain $$\{A*(a+jb)+B\}/\{C*(a+jb)+D\} = Z_0.$$

When the matching circuit is of the L-type (FIG. 2), we obtain:
A=1,
B=jX,
C=jY, and
D=1−X * Y.

When the matching circuit is of the inverted L-type, we obtain:
A=1−X * Y,
B=jX,
C=jY, and
D=1.

From the above, when the matching circuit is of the L-type, we obtain:

$$Y=\pm(1/Z_O)(Z_O/a-1)^{\frac{1}{2}},$$

and $$X=Z_O*a*Y-b.$$

When the matching circuit is of the inverted L-type, we obtain:

$$X=\pm\{(Z_o/a)*(a^2+b^2-Z_o*a)\}^{\frac{1}{2}}.$$

and $$Y=(b+X) / (Z_O* a+X * b).$$

Therefore, we can determine the value of each element (L or C) of the matching circuit based on the following:
if X>0, then X=jωL,
if X<0, then X=−j/ωC,
if Y>0, then Y=jωC, and
if Y<0, then Y=−j/ωL.

We will next give a description of the calculation method for the simulation of the matching circuit.

Giving an outline of this simulation, the circuit parameters determined as described above are substituted into the matching circuit shown in FIG. 5 to convert it into the S matrix, the result ($S_{11}$ or $S_{22}$) now being measured from the DUT being transformed and displayed in real time based on the S matrix resulting from this conversion. As a result, the marker point moves to the point of ($Z_O+j0$) (i.e., the match is obtained). Thus, the characteristic of the DUT with the matching circuit connected can be observed over the entire range of the operating frequency, without manufacturing and connecting an actual matching circuit. Furthermore, because the user is allowed to modify/set the circuit parameters, more practical matching circuit simulation can be performed by modifying the circuit parameters obtained through the foregoing calculations to, for example, values of elements actually available. A specific method for the calculation will be described next.

The four-terminal matrix of the parameters A, B, C, and D is transformed to an S matrix as follows:

$$S_{11}=(A+B/Z_O-Z_O* C-D) / \Delta,$$

$$S_{22}=(D+B/Z_0-Z_0* C-A) / \Delta, \text{ and}$$

$$S_{21}=S_{12}=2/\Delta,$$

wherein $$\Delta=A+B/Z_O*C+D.$$

The S matrix of an L-type matching circuit with the reactance X and the susceptance Y of the elements given is obtained as follows:

$$S_{11}=\{X*Y+j(X/Z_O-Z_O*Y)\}/\Delta,$$

$$S_{22}=\{-X*Y+j(X/Z_O-Z_O*Y)\}/\Delta, \text{ and}$$

$$S_{21}=S_{12}=2/\Delta,$$

wherein $$\Delta=2-X*Y+j-(X/Z_O+Z_O*Y),$$

and
and the values of X and Y are:
X=jωL (or −j/ωC), and
Y=jωC (or −j/ωL).

The S matrix of an inverted L-type matching circuit with the reactance X and the susceptance Y o the elements given is obtained as follows:

$$S_{11}=\{-X*Y+j(X/Z_O-Z_O*Y)\}/\Delta,$$

$$S_{22}=\{X*Y+j(X/Z_O-Z_O*Y)\}/\Delta,$$

and $$S_{21}=S_{12}=2/\Delta,$$

wherein $$\Delta=2-X*Y+j(X/Z_O+Z_O*Y),$$

and the values of X and Y are:
X=jωL (or, −j/ωC), and
Y=jωC (or, −j/ωL).

Let the data being measured ($S_{11}$) be $S_m(w)$. The data $S_{disp}$ which is to be measured if the matching circuit obtained as above is connected to the DUT will be as follows:

$$S_{disp}S_{11}+S_{12}*S_{21}*S_m/(1+S_{22}*S_m)$$

Figure 7:
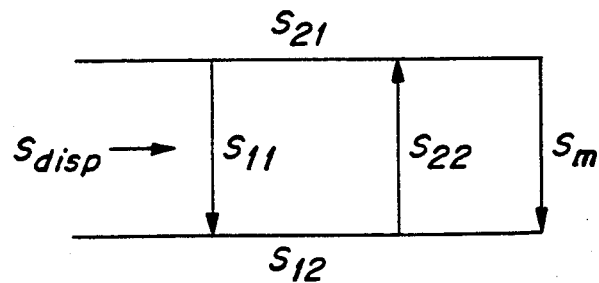
FIG. 7 is a diagram illustrating matching circuit simulation carried out by using a network analyzer in accordance with an embodiment of the present invention.

The value $S_{disp}$ represents an offset from the perfectly matched state (at each frequency). FIG. 7 schematically illustrates the relationship between $S_{disp}$, the S parameter $S_{11}$ of the DUT ($S_m$) and the S parameters $S_{11}$, $S_{21}$, $S_{12}$, and $S_{22}$ of the matching circuit.

Accordingly, one can display in real time how the overall $S_n$ of the DUT would appear if a given matching circuit were added thereto, without actually building the matching circuit and connecting it to the DUT, by computing $S_{disp}$ in accordance with the above formulae while measuring the S parameter $S_{11}$ ($S_m$) of the DUT, and then displaying $S_{disp}$ on the display 17 instead of $S_{11}$ of the DUT. Thus, because the simulation of a matching circuit can be done in real time, the variation of the matching state can be observed over a desired frequency range while, for instance, changing the temperature of the DUT.

Furtherore, instead of simulating the results of connecting the matching circuit to the DUT, the parameters and/or circuit type of the matching circuit can be entered from, for example, a keyboard of the network analyzer used for the above-described matching circuit simulation. The matching circuit simulation can thus be performed with not only the type of matching circuit the network analyzer has determined, but also any other arbitrary type designated by the user.

The significance of the capability of simulating a matching circuit of an arbitrary circuit type is as follows:

To calculate the matching circuit by designating one point with the marker on a curve (representing S parameters of the DUT) drawn on the display as a result of measurement of the DUT is to determine the circuit type of the matching circuit together with the values of the circuit elements of that matching circuit which make a perfect match at the frequency corresponding to that point (note that each point on the Smith chart represents the value of, e.g., $S_{11}$ at a particular frequency). However, the range over which the matching circuit simulation is performed is not limited to one frequency. What is simulated is the state of matching over a certain frequency range. Although perfect matching need not be obtained for a particular frequency, it is typically desired that the degree of matching be no less than a certain value at any frequency over a prescribed frequency range.

Accordingly, it is highly advantageous to have the capability of trying another circuit type in the event it is found that the circuit type selected by the network analyzer does not yield the expected matching state over the entire frequency range required. More specifically, the user may repeat the simulation, on a trial and error basis, using various circuit types and/or values of the elements while observing the matching state over the desired frequency range by entering, through the keyboard, the circuit type together with element values that do not provide a perfect match at the frequency corresponding to the point previously designated with the marker. Once an acceptable result is obtained, the corresponding circuit may be employed.

FIG. 8 shows an example of the procedures for designing the matching circuit by using a network analyzer in accordance with the present invention. It should be noted that "SELECT ANOTHER MATCHING CIRCUIT" in Step 809 refers to not only the circuit types determined by the network analyzer of the present invention as being realizable ones but also other arbitrary ones.

As described above in detail, the present invention makes it possible to easily obtain an accurate matching circuit without the inaccurate and troublesome operations of plotting the measured points on the Smith chart and making calculations with a handheld electronic calculator using the result obtained with a rough constant-R or constant-G circle. In addition, the present invention makes it possible to instantly observe the characteristics of a matching circuit without actually manufacturing that circuit. Moreover, it is possible to automatically modify the circuit parameters of the matching circuit thus determined so as to limit those values to available elements and quickly observe how that modification affects the degree of matching. Moreover, the efficiency of the matching circuit design may be further improved by omitting any type of matching circuit that necessitates the use of unrealistic circuit elements for a given DUT.

Although a specific embodiment of the invention has been described, many modifications of that embodiment will be within the true scope of the invention as set forth in the following claims. For example, the true scope of the invention is intended to include methods and apparatus that measure parameters of a DUT other than S parameters, e.g., impedances, admittances, etc. Moreover, the invention is not limited to network analyzers.

What is claimed is:

1. A network analyzer, comprising:
   measuring means for measuring an S parameter of a device under test (DUT) and providing a signal indicative of said S parameter;
   means for determining on the basis of said S parameter a circuit parameter of a matching circuit for matching the DUT to a prescribed impedance; and
   means for analytically calculating, on the basis of said S parameter and said circuit parameter, a result to be measured, at a plurality of frequencies, in case said matching circuit is added to the DUT, whereby said result to be measured is determinable without actually manufacturing a matching circuit designed to provide said circuit parameter and without connecting a manufactured matching circuit to the DUT.

2. A network analyzer according to claim 1, further comprising means for selectively modifying said circuit parameter.

3. A network analyzer according to claim 2, further comprising means for determining the types of matching circuit that can be implemented.

4. A method for operating a network analyzer to estimate the performance, over a range of frequencies, of a device under test (DUT) when matched to a prescribed impedance, comprising:
   measuring an S parameter of said device under test and providing a signal indicative of said S parameter;
   determining on the basis of said S parameter a circuit parameter of a matching circuit for matching the DUT to a prescribed impedance; and
   analytically calculating, on the basis of said S parameter and said circuit parameter, a result to be measured, at a plurality of frequencies, in case said matching circuit is added to the DUT, thereby determining said result to be measured is without actually manufacturing a matching circuit designed to provide said circuit parameter and without connecting a manufactured matching circuit to the DUT.

* * * * *